US012656672B2

(12) United States Patent
Cheng et al.

(10) Patent No.: US 12,656,672 B2
(45) Date of Patent: Jun. 16, 2026

(54) EXPOSURE MASK

(71) Applicant: VisEra Technologies Company Limited, Hsin-Chu City (TW)

(72) Inventors: Yueh-Ching Cheng, Hsinchu City (TW); Linya Tseng, Zhubei City (TW); Jyun-You Lu, Tianzhong Township, Changhua County (TW)

(73) Assignee: VisEra Technologies Company Limited, Hsin-Chu City (TW)

( * ) Notice: Subject to any disclaimer, the term of this patent is extended or adjusted under 35 U.S.C. 154(b) by 606 days.

(21) Appl. No.: 17/166,633

(22) Filed: Feb. 3, 2021

(65) Prior Publication Data

US 2022/0244631 A1 Aug. 4, 2022

(51) Int. Cl.
*G03F 1/38* (2012.01)
*G03F 1/80* (2012.01)
*G03F 7/24* (2006.01)

(52) U.S. Cl.
CPC .................. *G03F 1/38* (2013.01); *G03F 1/80* (2013.01); *G03F 7/24* (2013.01)

(58) Field of Classification Search
CPC ................ G03F 1/38; G03F 1/80; G03F 7/24
See application file for complete search history.

(56) References Cited

U.S. PATENT DOCUMENTS

2001/0017693 A1 8/2001 Zheng et al.
2005/0233226 A1* 10/2005 Osawa ................ G03F 7/70591
430/30

2006/0210887 A1* 9/2006 Henkel ..................... G03F 1/38
430/323
2008/0020292 A1* 1/2008 Gardiner ............. G03F 7/70941
430/30
2008/0248408 A1* 10/2008 MacDonald .............. G03F 1/00
430/5
2010/0055586 A1 3/2010 Fujimura et al.
2014/0308604 A1* 10/2014 Yoshioka ................. G03F 1/38
430/5
2020/0083224 A1* 3/2020 Chang ................... H10B 12/05

FOREIGN PATENT DOCUMENTS

CN 101520610 A 9/2009
CN 102998893 A 3/2013
CN 108490637 A 9/2018
CN 109661616 A 4/2019
(Continued)

OTHER PUBLICATIONS

An European Search Report mailed Dec. 7, 2021 in EP Application No. 21178183.6, 7 pages.
(Continued)

*Primary Examiner* — Jonathan Johnson
*Assistant Examiner* — Jayson D Cosgrove
(74) *Attorney, Agent, or Firm* — MUNCY, GEISSLER, OLDS & LOWE, P.C.

(57) ABSTRACT

An exposure mask is provided. The exposure mask includes a plurality of pattern blocks for defining a plurality of pattern profiles. Each pattern block includes a plurality of pattern units having mask patterns, and the mask patterns are formed in an asymmetric arrangement. The exposure mask may be a binary exposure mask for forming pattern profiles with curved surfaces.

15 Claims, 4 Drawing Sheets

(56)          References Cited

FOREIGN PATENT DOCUMENTS

| CN | 210721012 | U | 6/2020 |
|---|---|---|---|
| JP | 2002341516 | A | 11/2002 |
| JP | 2003315515 | A | 11/2003 |
| JP | 2005258387 | A | 9/2005 |
| JP | 2006243737 | A | 9/2006 |
| JP | 2006308842 | A | 11/2006 |
| KR | 20060116491 | A | 11/2006 |
| TW | 201926542 | A | 7/2019 |

OTHER PUBLICATIONS

Office Action mailed Aug. 30, 2022 in JP Application No.—is attached,—pages.

\* cited by examiner

EXPOSURE MASK

BACKGROUND

Technical Field

The embodiments of the present disclosure, are related to exposure masks, in particular they are related to binary exposure masks for forming pattern profiles with curved surfaces.

Description of the Related Art

Exposure masks may be used for photosensitive materials to form photoresist patterns. For example, the photoresist (which includes a photosensitive material) may be processed in three dimensions by giving the photoresist the required exposure distribution, and a silicon or glass substrate or the like may be etched into the desired shape using the photoresist as a mask. With advancements in technology, photoresist patterns are becoming more complex.

In general, multiple exposures using a plurality of exposure masks are used to form patter profiles with curved surfaces. However, this method not only increases the processing time, but it also increases the overall cost. Recently, a gradation mask method has been used to form pattern profiles with curved surfaces. In this method, the amount of light transmission depends on the thickness of the light-blocking layer on the (gradation) exposure mask. However, this method requires more steps (e.g., repeating lithography and etching fabrication processes) to form the light-blocking layer with different thicknesses (or a variable thickness).

BRIEF SUMMARY

In some embodiments of the present disclosure, the exposure mask may be a binary exposure mask for forming pattern profiles with curved surfaces. The exposure mask includes a plurality of pattern blocks. Each pattern block includes a plurality of pattern units having mask patterns. In the embodiments of the present disclosure, the mask patterns are formed in an asymmetric arrangement, which may be generated by one-time lithography and etching fabrication process rather than repeating lithography and etching fabrication processes. Therefore, the process steps may be simplified, and the processing time and the overall cost may be effectively reduced.

In accordance with some embodiments of the present disclosure, an exposure mask is provided. The exposure mask includes a plurality of pattern blocks for defining a plurality of pattern profiles. Each pattern block includes a plurality of pattern units having mask patterns, and the mask patterns are formed in an asymmetric arrangement.

In some embodiments, the mask patterns have different shapes.

In some embodiments:, the different shapes include a rectangle, a square, a circle, a diamond, a dart, a frame, or an irregular shape.

In some embodiments, the mask patterns are formed as squares, and the width of each square is eater than 0, and less than or equal to 360 nm.

In some embodiments, the mask patterns are formed as diamonds, and the length of one side of each diamond is greater than 0, and less than or equal to 360 nm.

In some embodiments, the mask patterns are formed as circles, and the diameter of each circle is greater than 0, and less than or equal to 360 nm.

In some embodiments, one of the mask patterns has at least two widths.

In some embodiments, one of the pattern units has at least two mask patterns.

In some embodiments, the width of each pattern unit is between 180 nm and 400 nm.

In some embodiments, the thickness of each pattern block is constant.

In some embodiments, there is a different number of pattern units in each pattern block.

In some embodiments, the pattern profiles include asymmetric concave profiles.

In some embodiments, the pattern profiles include asymmetric convex profiles.

In some embodiments, each pattern profile has variable curvature.

In some embodiments, the pattern blocks are divided into a light-blocking portion and a transparent portion, and the mask patterns are formed of the light-blocking portion and the transparent portion.

In some embodiments, the material of the light-blocking portion includes chromium or silicon dioxide.

In some embodiments, the pattern units of each pattern block form an M×N array, and M and N are positive integers greater than or equal to 1.

In some embodiments, the pattern profiles are used for etching silicon, silicon-hydrogen compounds, silicon dioxide, or a combination thereof.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
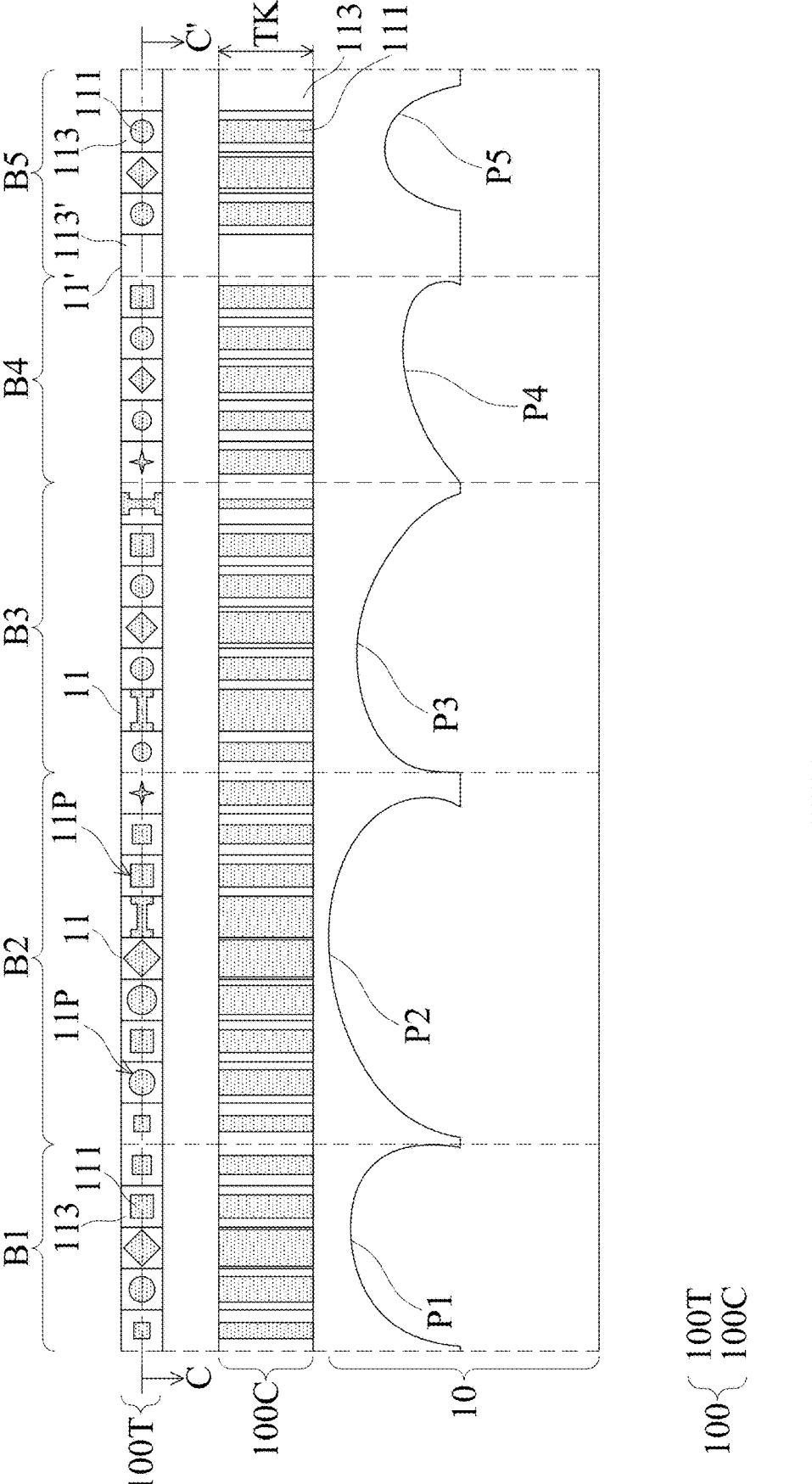
FIG. 1 illustrates a partial top view of the exposure mask, a partial cross-sectional view of the exposure mask, and a partial cross-sectional view of the photoresist layer in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative tern's, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +1-2% of the stated value, more typically +1-1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terns such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 illustrates a partial top view 100T of the exposure mask 100, a partial cross-sectional view 100C of the exposure mask 100, and a partial cross-sectional view of the photoresist layer 10 in accordance with some embodiments of the present disclosure. As shown in FIG. 1, the partial top view 100T and the partial cross-sectional view 100C of the exposure mask 100 may correspond to each other. That is, the partial cross-sectional view 100C of the exposure mask 100 may be a partial cross-sectional view along a section-line C-C' of the partial top view 100C of the exposure mask 100, but the present disclosure is not limited thereto.

It should be noted that the pattern profiles P1-P5 of the photoresist layer 10 are shown as two-dimensional patterns in the partial cross-sectional view of the photoresist layer 10 in FIG. 1, but the pattern profiles P1-P5 of the photoresist layer 10 should actually be three-dimensional patterns that have curved surfaces.

Referring to FIG. 1, the exposure mask 100 includes a plurality of pattern blocks B1-B5 for defining a plurality of pattern profiles. (e.g., the pattern profiles P1-P5 of the photoresist layer 10). Moreover, each pattern block includes a plurality of pattern units 11. As shown in FIG. 1, each pattern unit 11 may have at least one mask pattern 11P, and the mask patterns 11P of the pattern units 11 are formed in an asymmetric arrangement.

In some embodiments, the pattern blocks B1-B5 may be divided into a light-blocking portion 111 and a transparent portion 113. As shown in FIG. 1, each mask pattern 11P of the pattern unit 11 is formed of the light-blocking portion 111 and the transparent portion 113. It should be noted that some pattern units 11 may be formed of only light-blocking portion 111 or only transparent portion 113. For example, the pattern unit 11' of the pattern block B5 is formed of only transparent portion 113', so that the pattern unit 11' may have no mask pattern 11P.

In some embodiments, the material of the light-blocking portion 111 may include chromium (Cr) or silicon dioxide ($SiO_2$), and the material of the transparent portion 113 may include glass (e.g., high energy beam sensitive (REBS) glass), but the present disclosure is not limited thereto.

Figure 2:
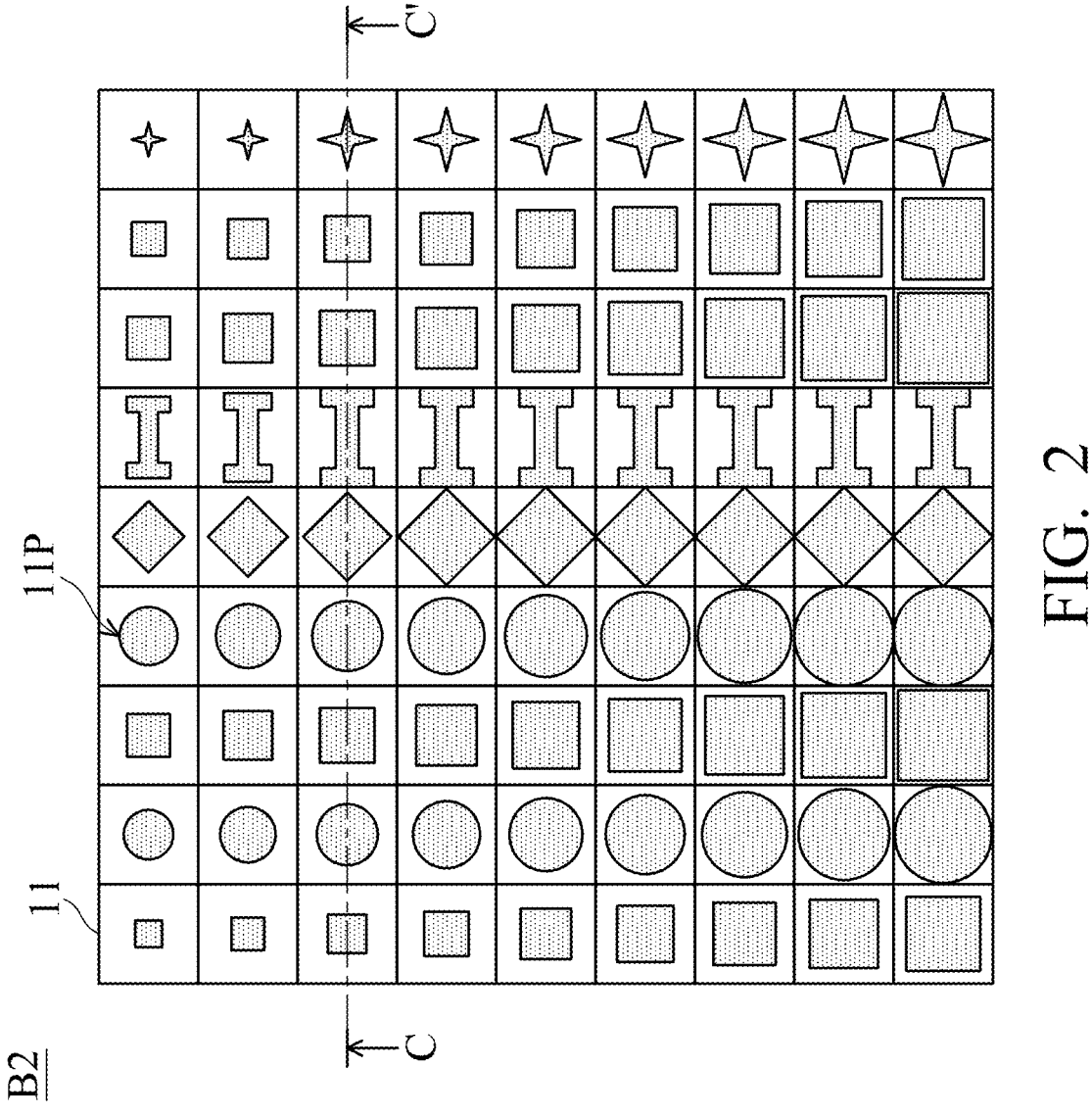
FIG. 2 illustrates a top view of the pattern block in accordance with some embodiments of the present disclosure.

It some embodiments, the pattern units 11 of each pattern block may form an M×N array, where M and N are positive integers greater than or equal to 1. FIG. 2 illustrates a top view of the pattern block B2 in accordance with some embodiments of the present disclosure. As shown in FIG. 2, the pattern block B2 includes eighty-one pattern units 11, and the eighty-one pattern units 11 form a 9×9 array, but the present disclosure is not limited thereto. The partial top view and the partial cross-sectional view of the pattern block B2 shown FIG. 1 may be the top view and the cross-sectional view of the third row of the pattern block B2 shown in FIG. 2, but the present disclosure is not limited thereto.

In some embodiments, as shown in FIG. 1, the number of pattern units 11 of each pattern block may be different. For example, in the partial top view 100T and the partial cross-sectional view 100C of the exposure mask 100 shown in FIG. 1, the pattern block B1 is illustrated to include five pattern units 11 (which may form a 5×5 array), the patterns block B2 is illustrated to include nine pattern units 11 (which may form a 9×9 array), the pattern block B3 is illustrated to include seven pattern units 11 (which may form a 7×7 array), the pattern block B4 is illustrated to include five pattern units 11 (which may form a 5×5 array), and the pattern block B5 is illustrated to include five pattern units 11 (which may form a 5×5 array), but the present disclosure is not limited thereto.

Moreover, the number of pattern units 11 in one row of the pattern block and the number of pattern units 11 in one column of the pattern block may be different. For example, the pattern block B2 may include sixty-three pattern units 11 (which may form a 9×7 array). That is, in the embodiments of the present disclosure, M and N are positive integers greater than or equal to 1, and M and N may be different from each other.

In some embodiments, the material of the photoresist layer 10 may include silicon oxide ($SiO_2$), silicon nitride (SiN), silicon oxynitride (SiON), silicon carbide (SW), silicon carbonitride (SiCN), the like, or a combination thereof, but the present disclosure is not limited thereto. Moreover, the photoresist layer 10 may be a single layer or a multilayer structure, which may be modified depending on actual need.

As shown in FIG. 1, the photoresist layer 10 may be a positive photoresist layer. That is, a portion of the photoresist layer 10 that corresponds to the light-blocking portion 111 of the pattern blocks B1-B5 (which may be unexposed to light) remains insoluble to the photoresist developer, and another portion of the photoresist layer 10 that corresponds to the transparent portion 113 of the pattern blocks B1-B5 (which may be exposed to light) becomes soluble to the photoresist developer, but the present disclosure is not limited thereto.

In some other embodiments, the photoresist layer 10 may be a negative photoresist layer. That is, a portion of the photoresist layer 10 that corresponds to the light-blocking portion 111 of the pattern blocks B1-B5 (which may be unexposed to light) is dissolved by the photoresist developer, and another portion of the photoresist layer 10 that corresponds to the transparent portion 113 of the pattern blocks B1-B5 which may be exposed to light) becomes insoluble to the photoresist developer.

As shown in FIG. 1 (and FIG. 2), the mask patterns I1P may have different shapes, so that the pattern blocks B1-B5 may define different pattern profiles P1-P5 for the photoresist layer 10. In the embodiment shown in FIG. 1, since the photoresist layer 10 is a positive photoresist layer, the pattern profiles P1-P5 are formed as asymmetric convex profiles that are different from each other, but the present disclosure is not limited thereto. In some other embodiments, if the photoresist layer 10 is a negative photoresist layer, then the pattern profiles P1-P5 may be formed as asymmetric concave profiles that are different from each other. Moreover, in some embodiments, each of the pattern blocks B1-B5 may have variable curvature as shown in FIG. 1.

As shown in FIG. 1, the thickness TK of each of the pattern blocks B1-B5 is constant (i.e., the pattern blocks B1-B5 have the same height). In more detail, the thickness of the light-blocking portion 111 of the pattern blocks B1-B5 is constant. That is, the exposure mask 100 is a binary mask, which may be generated by one-time lithography and etching fabrication process rather than repeating lithography and etching fabrication processes. Therefore, the process steps may be simplified, and the processing time and the overall cost may be effectively reduced.

In some embodiments, the pattern profiles P1-P5 (i.e., three-dimensional patterns that have curved surfaces) of the photoresist layer 10 may be used as a hard mask for etching silicon (substrates), silicon-hydrogen compounds $(SiH_x)$ (substrates), silicon dioxide $(SiO_2)$ (substrates) the like, or a combination thereof, but the present disclosure is not limited thereto.

FIGS. 3A-3G are different examples of the mask patterns 11P. In more detail, FIGS. 3A-3G are top views of different mask patterns 11P. In the embodiments shown in FIGS. 3A-3G, each pattern unit 11 is formed as a square, and the width T of each pattern unit 11 may be between about 180 nm and about 400 nm, but the present disclosure is not limited thereto.

Figures 3A, 3B, 3C, 3D, 3E, 3F, 3G:
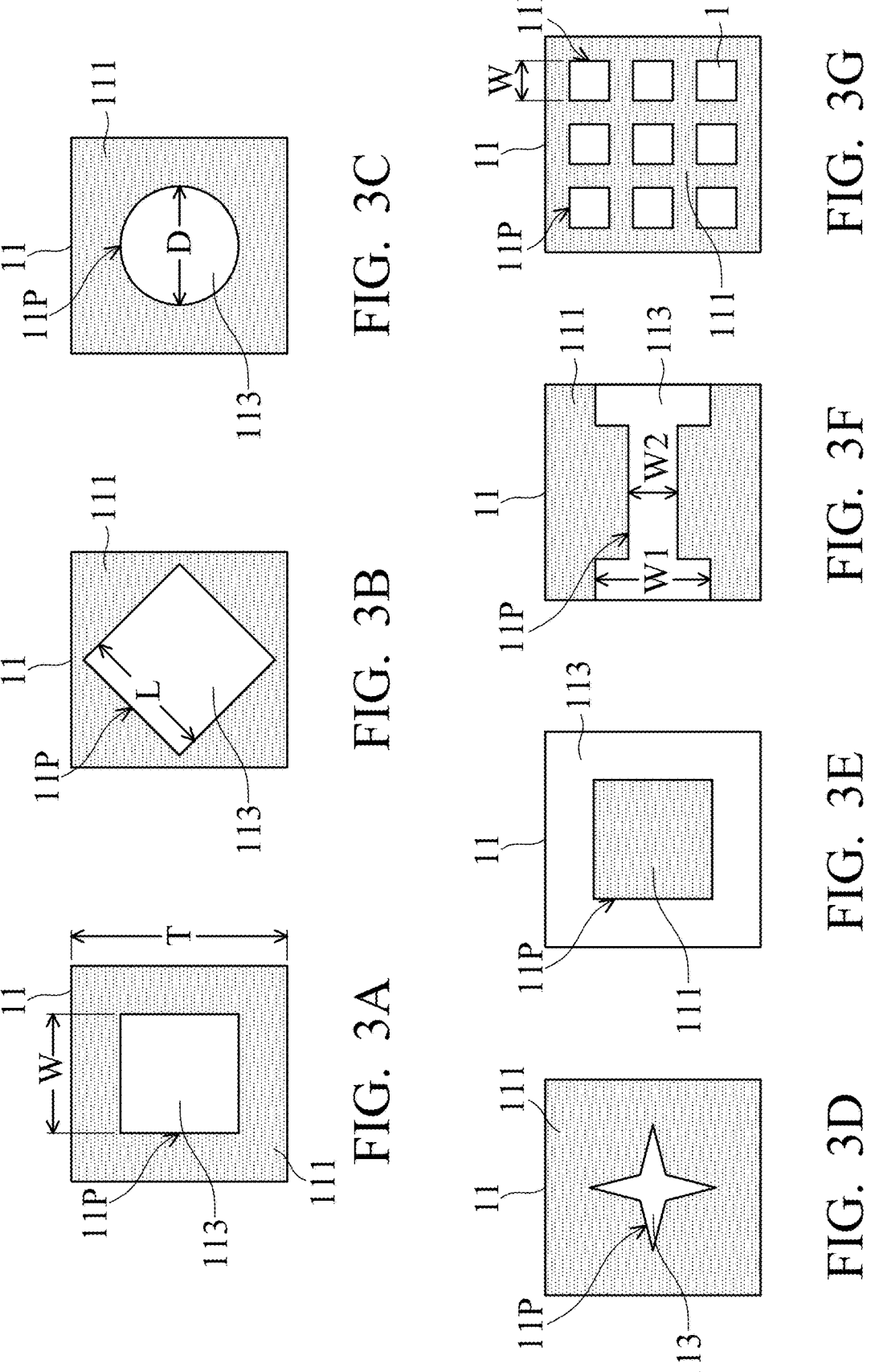
FIGS. 3A-3G are different examples of the mask patterns.

As shown in FIG. 3A, the transparent portion 113 is formed to have a square shape, and the light-blocking portion 111 is formed to surround the transparent portion 113 (e.g., the light-blocking portion 1111 is formed to have a frame shape), so that the mask pattern 11P of the pattern unit 11 shown in FIG. 3A is formed as a square, but the present disclosure is not limited thereto. In some embodiments, the width W of the square may be greater than 0, and less than or equal to about 360 nm, but the present disclosure is not limited thereto. In some other embodiments, the width W of the square may be greater than about 120 nm and less than about 240 nm.

As shown in FIG. 3B, the transparent portion 113 is formed to have a diamond shape, and the light-blocking portion 111 is formed to surround the transparent portion 113, so that the mask pattern 11P of the pattern unit 11 shown in FIG. 3B is formed as a diamond, but the present disclosure is not limited thereto. In some other embodiments, the light-blocking portion 111 may be formed to have a diamond shape, and the transparent portion 113 may be formed to surround the light-blocking portion 111. In some embodiments, the length L a side of the diamond may be greater than 0, and less than or equal to about 360 nm, but the present disclosure is not limited thereto. In some other embodiments, the length L of a side of the diamond may be greater than about 120 nm and less than about 240 nm.

As shown in FIG. 3C, the transparent portion 113 is formed to have a circle shape, and the light-blocking portion 111 is formed to surround the transparent portion 113, so that the mask pattern 11P of the pattern unit 11 shown in FIG. 3C is formed as a circle, but the present disclosure is not limited thereto. In some other embodiments, the light-blocking portion 111 may be formed to have a circle shape, and the transparent portion 113 may be formed to surround the light-blocking portion 111. In some embodiments, the diameter D of the circle may be greater than 0, and less than or equal to about 360 nm, but the present disclosure is not limited thereto. In some other embodiments, the diameter D of the circle may be greater than about 120 nm and less than about 240 nm.

As shown in FIG. 3D, the transparent portion 113 is formed to have a dart shape, and the light-blocking portion 111 is formed to surround the transparent portion 113, so that the mask pattern 11P of the pattern unit 11 shown in FIG. 3D is formed as a dart, but the present disclosure is not limited thereto. In some other embodiments, the light-blocking portion 111 may be framed to have a dart shape, and the transparent portion 113 may be formed to surround the light-blocking portion 111.

As shown in FIG. 3E, the light-blocking portion 111 is formed to have a square shape, and the transparent portion 113 is formed to surround the light-blocking portion 111 (e.g., the transparent portion 113 is formed to have a frame shape), so that the mask pattern 11P of the pattern unit 11 shown in FIG. 3E is formed as a square, but the present disclosure is not limited thereto.

As shown in FIG. 3F, the transparent portion 113 is formed to have a shape formed of three rectangles, and the light-blocking portion 111 is formed on the upper side and the bottom side of the transparent portion 113, so that the mask pattern 11P of the pattern unit 11 shown in FIG. 3F is formed as a shape formed of three rectangles, but the present disclosure is not limited thereto. In some other embodiments, the positions of the light-blocking portion 111 and the transparent portion 113 may be exchanged with each other. In the embodiment shown in FIG. 3F, the mask pattern 11P has at least two different widths W1 and W2.

As shown in FIG. 3G, the transparent portion 113 is formed to have a plurality of squares (e.g., nine squares), and the light-blocking portion 111 is formed to surround the squares, so that the pattern unit 11 shown in FIG. 3G has a plurality of mask patterns 11P formed as squares, but the present disclosure is not limited thereto. In some other embodiments, the positions of the light-blocking portion 111 and the transparent portion 113 may be exchanged with each other. In some embodiments, each mask pattern 11P (each square) may have the same width W (e.g., 0-360 DM, or 120-240 nm).

Figure 4:
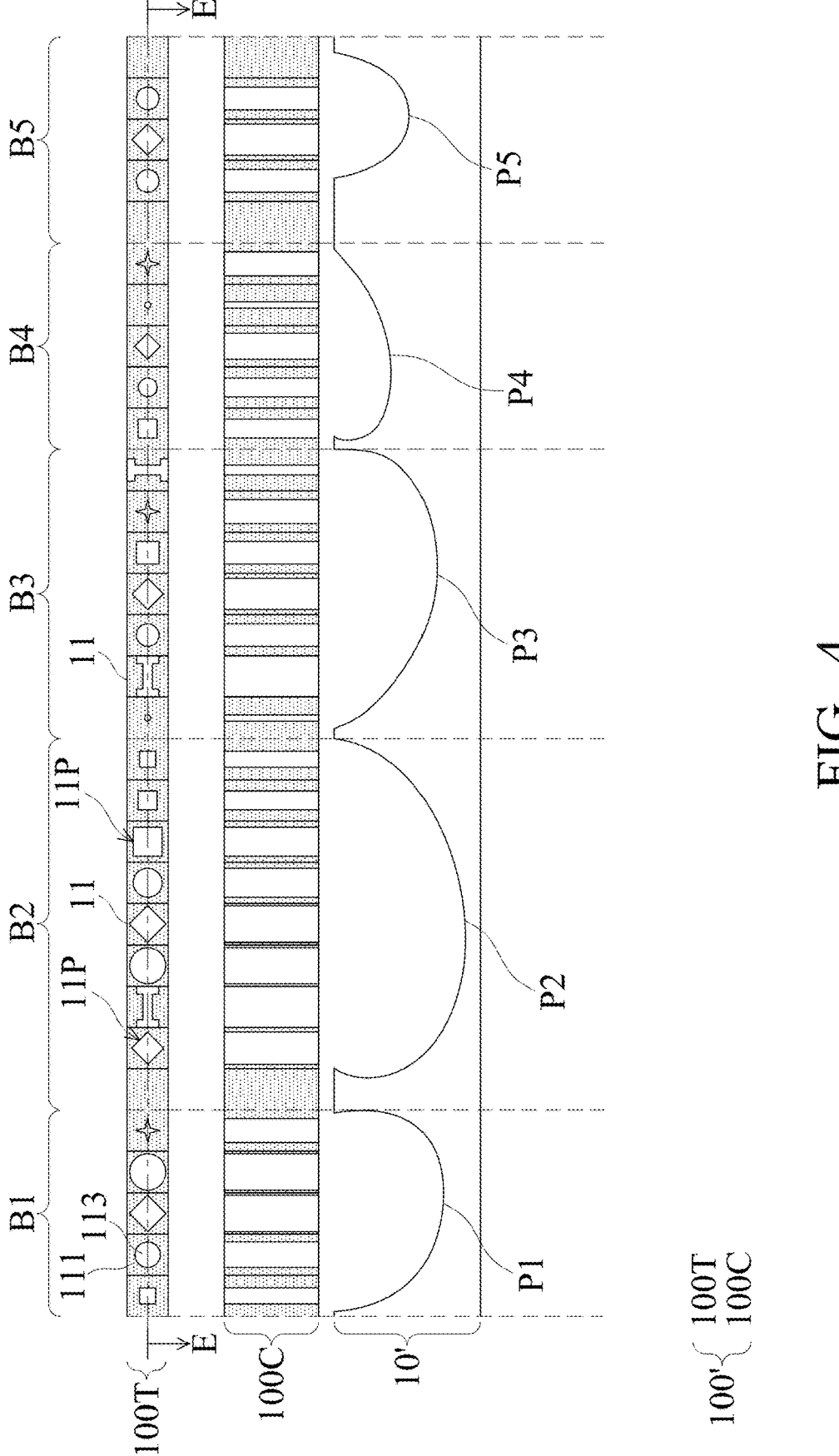
FIG. 4 illustrates a partial top view of the exposure mask, a partial cross-sectional view of the exposure mask, and a partial cross-sectional view of the photoresist layer in accordance with some other embodiments of the present disclosure.

FIG. 4 illustrates a partial top view 100T of the exposure mask 100', a partial cross-sectional view 100C of the exposure mask 100', and a partial cross-sectional view of the photoresist layer 10' in accordance with some other embodiments of the present disclosure. As shown in FIG. 4, the partial top view 100C and the partial cross-sectional view 100C of the exposure mask 100' may correspond to each other. That is, the partial cross-sectional view 100C of the exposure mask 100' may be a partial cross-sectional view along a section-line E-E' of the partial top view 100C of the exposure mask 100', but the present disclosure is not limited thereto.

Similarly, the pattern profiles P1-P5 of the photoresist layer 10' are shown as two-dimensional patterns in the partial cross-sectional view of the photoresist layer 10' in FIG. 4, but the pattern profiles P1-P5 of the photoresist layer 10' should actually three-dimensional patterns that have curved surfaces.

As shown in FIG. 4, the mask patterns 11P may have different shapes, so that the pattern blocks B1-B5 may define different pattern profiles P1-P5 for the photoresist layer 10'. In the embodiment shown in FIG. 4, the photoresist layer 10' is a positive photoresist layer, so that the pattern profiles P1-P5 are formed as asymmetric concave profiles that are different from each other, but the present disclosure is not limited thereto. In some other embodiments, if the photoresist layer 10' is a negative photoresist layer, then the pattern profiles P1-P5 may be formed as asymmetric convex profiles that are different from each other.

In summary, the exposure masks according to the embodiments of the present disclosure are the binary exposure masks for forming pattern profiles with curved surfaces, which include a plurality of pattern blocks. The mask patterns of the pattern blocks are formed in an asymmetric arrangement, which may be generated by one-time lithography and etching fabrication process rather than repeating lithography and etching fabrication processes. Therefore, the process steps may be simplified, and the processing time and the overall cost may be effectively reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An exposure mask, comprising:
   a plurality of pattern blocks for defining a plurality of pattern profiles,
   wherein each of the plurality of pattern blocks comprises a plurality of pattern units having mask patterns, the mask patterns are formed in an asymmetric arrangement, a thickness of each of the plurality of pattern blocks is constant, the mask patterns have different shapes, and the different shapes comprise at least two of a rectangle, a diamond, a dart, and a frame.

2. The exposure mask as claimed in claim 1, wherein the mask patterns are formed as squares, and a width of each of the squares is greater than 0, and less than or equal to 360 nm.

3. The exposure mask as claimed in claim 1, wherein the mask patterns are formed as diamonds, and a length of a side of each of the diamonds is greater than 0, and less than or equal to 360 nm.

4. The exposure mask as claimed in claim 1, wherein the mask patterns are formed as circles, and a diameter of each of the circles is greater than 0, and less than or equal to 360 nm.

5. The exposure mask as claimed in claim 1, wherein one of the mask patterns has at least two widths.

6. The exposure mask as claimed in claim 1, wherein one of the plurality of pattern units has at least two mask patterns.

7. The exposure mask as claimed in claim 1, wherein a width of each of the plurality of pattern units is between 180 nm and 400 nm.

8. The exposure mask as claimed in claim 1, wherein there is a different number of the plurality of pattern units in each of the pattern blocks.

9. The exposure mask as claimed in claim 1, wherein the plurality of pattern profiles comprises asymmetric concave profiles.

10. The exposure mask as claimed in claim 1, wherein the plurality of pattern profiles comprises asymmetric convex profiles.

11. The exposure mask as claimed in claim 1, wherein each of the plurality of pattern profiles has variable curvature.

12. The exposure mask as claimed in claim 1, wherein the plurality of pattern blocks is divided into a light-blocking portion and a transparent portion, and the mask patterns are formed of the light-blocking portion and the transparent portion.

13. The exposure mask as claimed in claim 12, wherein a material of the light-blocking portion comprises chromium or silicon dioxide.

14. The exposure mask as claimed in claim 1, wherein the plurality of pattern units of each of the plurality of pattern blocks form an M×N array, and M and N are positive integers greater than or equal to 1.

15. The exposure mask as claimed in claim 1, wherein the plurality of pattern profiles is used for etching silicon, silicon-hydrogen compounds, silicon dioxide, or a combination thereof.

\* \* \* \* \*